(12) United States Patent
Mohammed et al.

(10) Patent No.: US 8,946,757 B2
(45) Date of Patent: Feb. 3, 2015

(54) HEAT SPREADING SUBSTRATE WITH EMBEDDED INTERCONNECTS

(75) Inventors: Ilyas Mohammed, Santa Clara, CA (US); Masud Beroz, Apex, NC (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 13/399,941

(22) Filed: Feb. 17, 2012

(65) Prior Publication Data
US 2013/0214296 A1 Aug. 22, 2013

(51) Int. Cl.
*H01L 33/00* (2010.01)
*H01L 23/36* (2006.01)

(52) U.S. Cl.
USPC ......... 257/99; 257/88; 257/784; 257/E33.075

(58) Field of Classification Search
CPC ............. H05K 1/0203; H05K 1/0204; H05K 2201/10106; H01L 25/167; H01L 23/3677; H01L 2924/12041
USPC ......... 257/88, 99, 784, E33.075; 438/26, 122
See application file for complete search history.

(56) References Cited

U.S. PATENT DOCUMENTS

| | | | | |
|---|---|---|---|---|
| 7,633,154 B2* | 12/2009 | Dai et al. | | 257/712 |
| 7,706,144 B2* | 4/2010 | Lynch | | 361/704 |
| 7,974,099 B2* | 7/2011 | Grajcar | | 361/720 |
| 8,415,704 B2* | 4/2013 | Ivanov et al. | | 257/99 |
| 2001/0001292 A1* | 5/2001 | Bertin et al. | | 438/107 |
| 2003/0139032 A1 | 7/2003 | Kung et al. | | |
| 2003/0153108 A1* | 8/2003 | Durocher et al. | | 438/26 |
| 2003/0189830 A1* | 10/2003 | Sugimoto et al. | | 362/294 |
| 2004/0041757 A1* | 3/2004 | Yang et al. | | 345/82 |
| 2005/0156304 A1* | 7/2005 | Furuyama et al. | | 257/686 |
| 2006/0126308 A1 | 6/2006 | Campbell et al. | | |
| 2007/0010086 A1* | 1/2007 | Hsieh | | 438/622 |
| 2007/0080360 A1* | 4/2007 | Mirsky et al. | | 257/99 |
| 2007/0085101 A1* | 4/2007 | Kim | | 257/98 |
| 2008/0280393 A1* | 11/2008 | Lee et al. | | 438/107 |
| 2009/0014732 A1* | 1/2009 | Nishida et al. | | 257/88 |
| 2009/0057704 A1* | 3/2009 | Seo et al. | | 257/98 |
| 2009/0166664 A1 | 7/2009 | Park et al. | | |
| 2010/0244059 A1* | 9/2010 | Iida et al. | | 257/88 |
| 2010/0258900 A1* | 10/2010 | Chen et al. | | 257/499 |
| 2011/0042699 A1* | 2/2011 | Park et al. | | 257/98 |
| 2011/0101394 A1* | 5/2011 | Mckenzie et al. | | 257/98 |
| 2011/0227122 A1* | 9/2011 | Lin et al. | | 257/99 |
| 2012/0018868 A1* | 1/2012 | Oganesian et al. | | 257/686 |
| 2012/0068313 A1* | 3/2012 | Pagaila et al. | | 257/621 |
| 2012/0161190 A1* | 6/2012 | Yao | | 257/99 |

FOREIGN PATENT DOCUMENTS

WO   2012067177 A1   5/2012

OTHER PUBLICATIONS

IBM, et al.; Method of Producing Thin-Film Wirings With Vias; IBM Technical Disclosure Bulletin, Apr. 1, 1989; International Business Machines Corp. (Thornwood), US—ISSN 0018-8689; vol. 31, No. 11, pp. 209-210; https://priorart.ip.com.

* cited by examiner

*Primary Examiner* — Steven J Fulk

(57) ABSTRACT

Heat spreading substrate with embedded interconnects. In an embodiment in accordance with the present invention, an apparatus includes a metal parallelepiped comprising a plurality of wires inside the metal parallelepiped. The plurality of wires have a different grain structure than the metal parallelepiped. The plurality of wires are electrically isolated from the metal parallelepiped. The plurality of wires may be electrically isolated from one another.

16 Claims, 10 Drawing Sheets

Substrate 101     wire 120A     dielectric 120B

Substrate 101    wire 120A    dielectric 120B

US 8,946,757 B2

HEAT SPREADING SUBSTRATE WITH EMBEDDED INTERCONNECTS

FIELD OF INVENTION

Embodiments of the present invention relate to the field of integrated circuit design and manufacture. More specifically, embodiments of the present invention relate to systems and methods for a heat spreading substrate with embedded interconnects.

BACKGROUND

A variety of semiconductor devices, for example, light emitting diodes (LED), radio frequency (RF) devices, motor controllers, power semiconductors and the like, may be characterized as having high power density. For example, many LED devices may be said to run "hot." In addition, the substrates of many such devices, e.g., comprising sapphire or Gallium arsenide (GaAs), are not good conductors of heat. Conventional mounting and heat sinking methods and structures do not cost effectively remove the heat generated by such devices.

SUMMARY OF THE INVENTION

Therefore, what is needed are systems and methods for heat spreading substrate with embedded interconnects. What is additionally needed are systems and methods for heat spreading substrate with embedded interconnects that are simple and cost effective to manufacture. A further need exists for systems and methods for heat spreading substrate with embedded interconnects that are compatible and complementary with existing systems and methods of integrated circuit design, manufacturing and test. Embodiments of the present invention provide these advantages.

In a first embodiment in accordance with the present invention, an apparatus includes a metal parallelepiped comprising a plurality of wires inside the metal parallelepiped. The plurality of wires have a different grain structure than the metal parallelepiped. The plurality of wires are electrically isolated from the metal parallelepiped. The plurality of wires may be electrically isolated from one another.

In accordance with a method embodiment of the present invention, a plurality of wires are bonded to a substrate. A volume is filled with an electrically and thermally conductive material. The volume is in contact with the substrate and includes the plurality of wires. The electrically and thermally conductive material has a different grain structure from that of the plurality of wires. The plurality of wires may (or may not) be coated with a dielectric prior to or after the bonding.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1A:
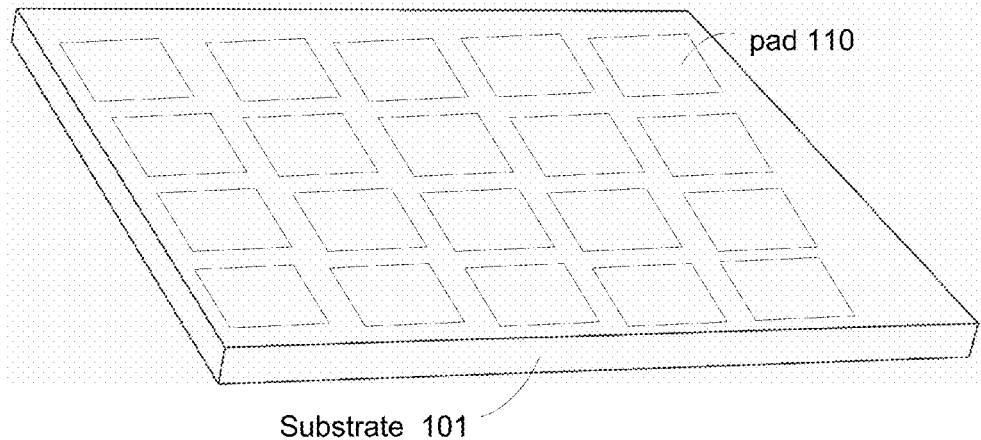
FIGS. 1A, 1B, 1C, 1D, 1E, 1F, 1G, 1H and 1I illustrate multiple methods of manufacture of a heat spreading substrate with embedded interconnects, in accordance with embodiments of the present invention.

Reference will now be made in detail to various embodiments of the invention, front facing piggyback wafer assembly, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating" or "processing" or "forming" or "roughening" or "filling" or "accessing" or "performing" or "generating" or "adjusting" or "creating" or "executing" or "continuing" or "indexing" or "processing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Heat Spreading Substrate With Embedded Interconnects

FIGS. 1A-1I illustrate multiple methods of manufacture of a heat spreading substrate with embedded interconnects 100, in accordance with embodiments of the present invention. FIG. 1A illustrates a substrate 101 comprising a plurality of wire bond pads 110, in accordance with embodiments of the present invention. Substrate 101 should be characterized as having a high thermal conductivity, e.g., having a thermal conductivity greater than that of sapphire ($\alpha$-$Al_2O_3$), 32 or 35 $W \cdot m^{-1} \cdot K^{-1}$, depending on the orientation. Substrate 101 may comprise any suitable material, e.g., metal and/or a metal film, including Copper (Cu), Aluminum (Al), metal powders, particle filled materials, Silicon, metal-filled epoxy, composite materials and the like. Substrate 101 may comprise multiple layers and may further comprise routing traces, in accordance with embodiments of the present invention.

Figure 1B:
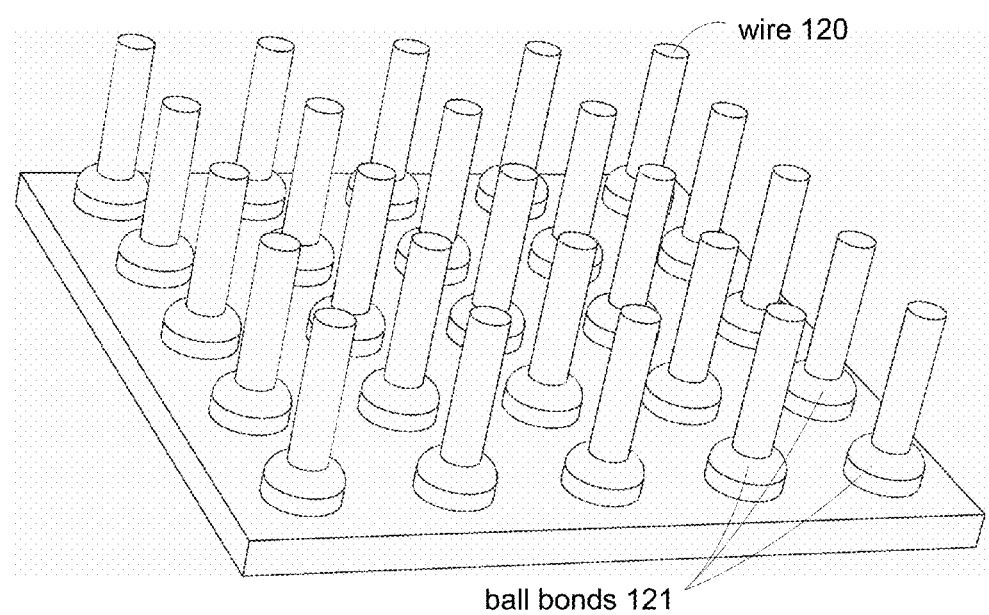

FIG. 1B illustrates the addition of a plurality of bond wires 120 applied to substrate 101, in accordance with embodiments of the present invention. Bond wires 120 may be applied via conventional wire-bonding techniques. Bond wires 120 may comprise Copper (Cu), Gold (Au), alloyed-Aluminum or any other suitable material. In accordance with embodiments of the present invention, the ball bonds 121 may touch one another. If the ball bonds 121 are in electrical contact, the ball bonds 121 may be optionally removed, as further described with respect to FIG. 1F, below.

The bond wires 120 may be substantially vertical, e.g., perpendicular to the substrate 101, or they may be formed and/or placed at an angle of up to about 30 degrees from the vertical, for example, as may occur with loop or stitch bonding.

Figure 1C:
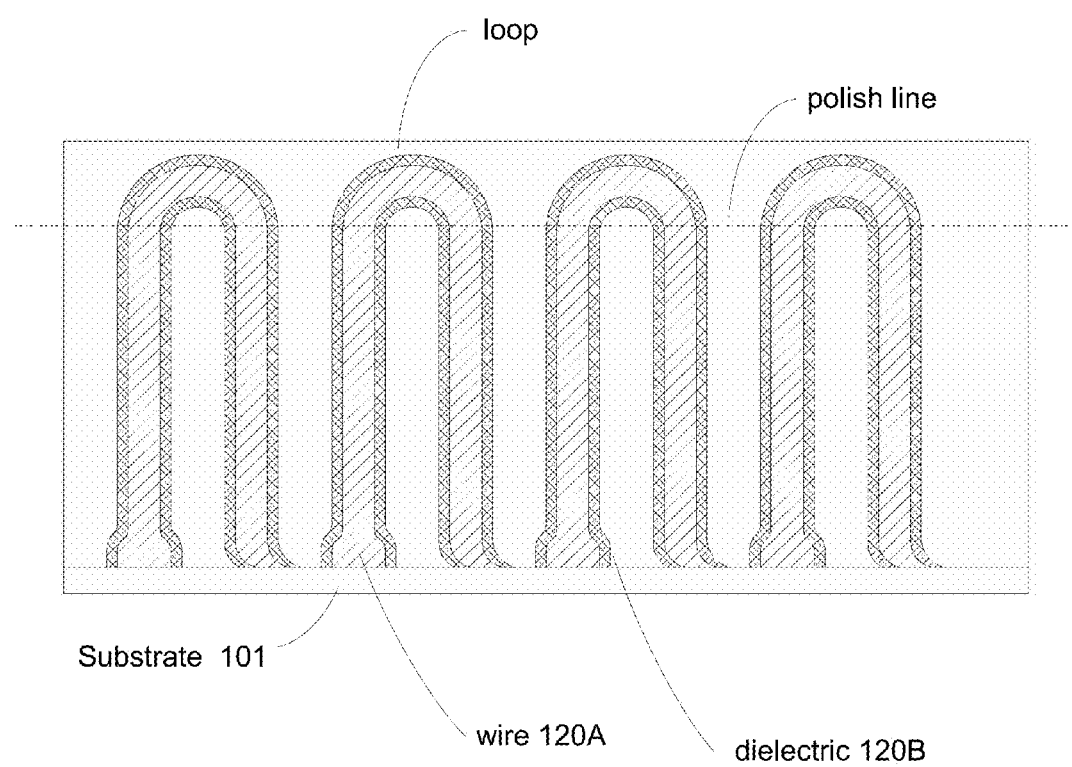

FIG. 1C illustrates the addition of a plurality of bond wires 120 applied to substrate 101, in accordance with embodiments of the present invention. In FIG. 1C, bond wires 120 are applied via loop or stitch bonding.

Figure 1D:
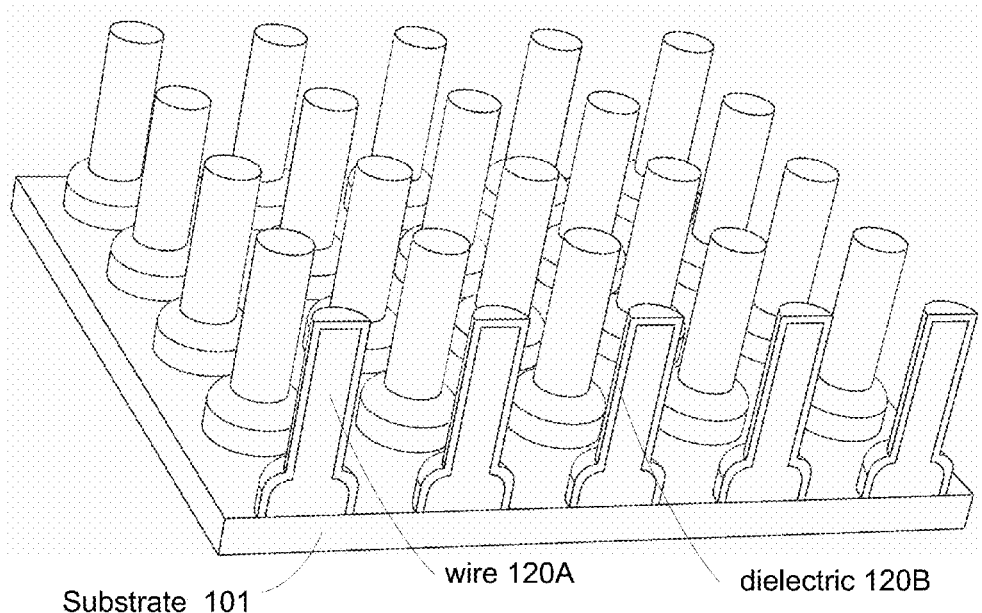

In accordance with embodiments of the present invention, wires 120 may comprise conductive wires 120A coated with a dielectric 120B, e.g., an electrophoretically deposited polymer or Silicon nitride. Alternatively, "bare" wires 120A may be coated with a dielectric 120B after wire bonding. FIG. 1D illustrates bonded conductors 120A coated with a dielectric 120B, in accordance with embodiments of the present invention.

Figure 1E:
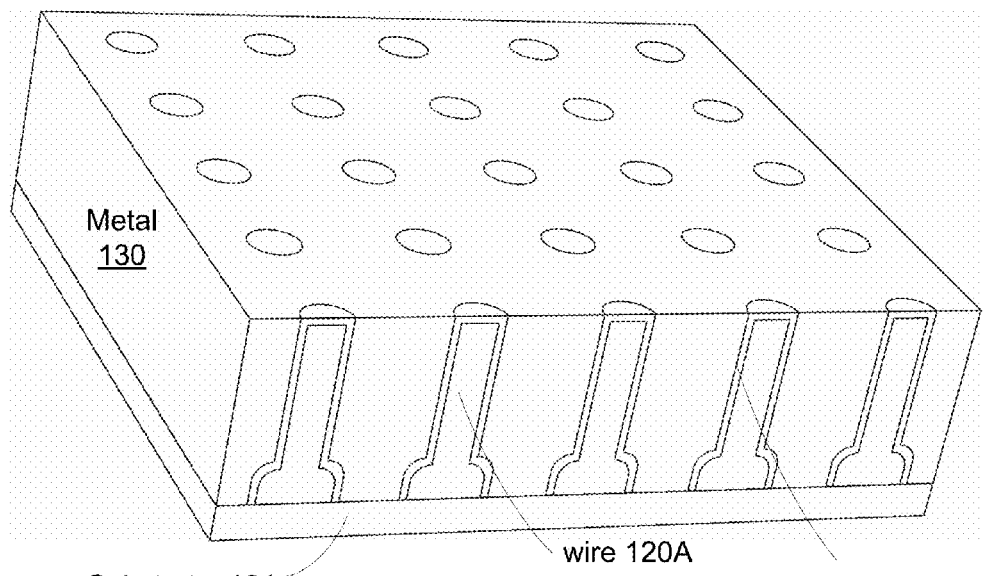

FIG. 1E illustrates metal 130 electroplated over substrate 101 and encompassing wires 120 and ball bonds 121, in accordance with embodiments of the present invention. In an alternative embodiment in accordance with the present invention, the volume of metal 130 may be filled by any suitable process utilizing any suitable material, e.g., a fill metal, electrically conductive epoxy, powdered metal and/or a metal-filled material.

Metal 130 generally forms a regular solid, e.g., a cuboid or parallelepiped. It is to be appreciated, however, that metal 130 is not completely solid, as it comprises gaps formed by the wires 120. It is to be further appreciated that metal 130, whether electroplated as illustrated in the embodiments of FIG. 1E, or formed via other methods, as described below, will have a different grain structure from the bond wires 120A, which are typically drawn wires.

Figure 1F:
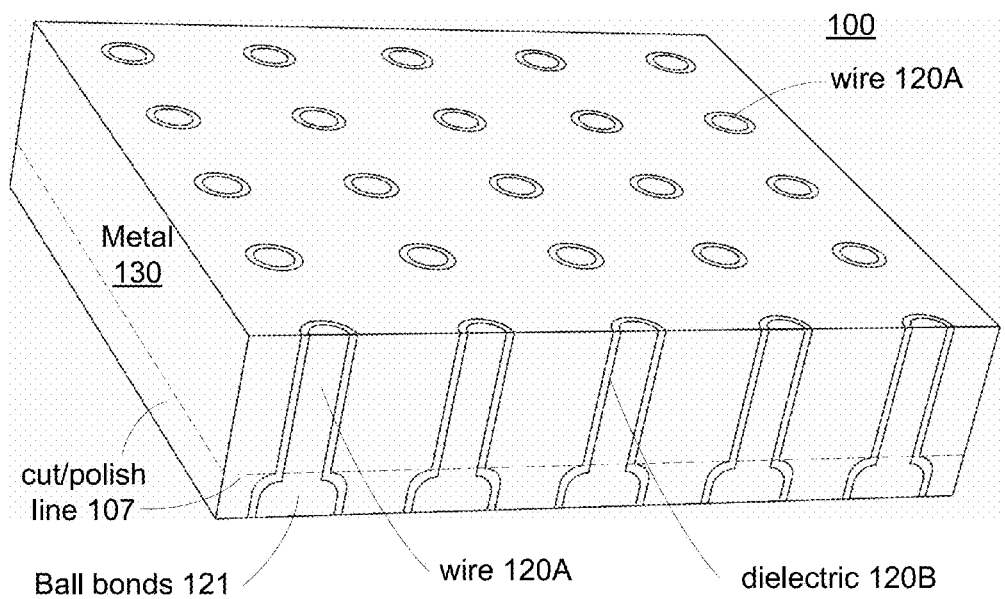

FIG. 1F illustrates a first embodiment of a heat spreading substrate with embedded interconnects 100, in accordance with embodiments of the present invention. In FIG. 1F, the substrate 101 is optionally removed, in accordance with embodiments of the present invention. In addition, the top surface is optionally polished, exposing the conductive portion of the wire bond, 120A, exposed on both the top and bottom surfaces of metal 130. For example, if the wires 120A comprise loop bonding, top surface polishing may eliminate the loop in the wire, electrically isolating the remaining wires.

FIG. 1F also illustrates optional cut/polish extent line 107. In accordance with embodiments of the present invention, substrate 101 and/or metal 130 may be cut and/or polished to cut/polish line 107 to remove ball bonds 121. In this novel manner, the wires 120 may be placed closer together, e.g., without a need to physically separate ball bonds 121 from one another, and heat spreading substrate with embedded interconnects 100 may achieve a denser interconnect structure with a finer pitch, in comparison to a technique requiring wires and balls to be electrically isolated. It is to be appreciated that cut/polish line 107 is well suited to all embodiments in accordance with the present invention.

Figure 1G:
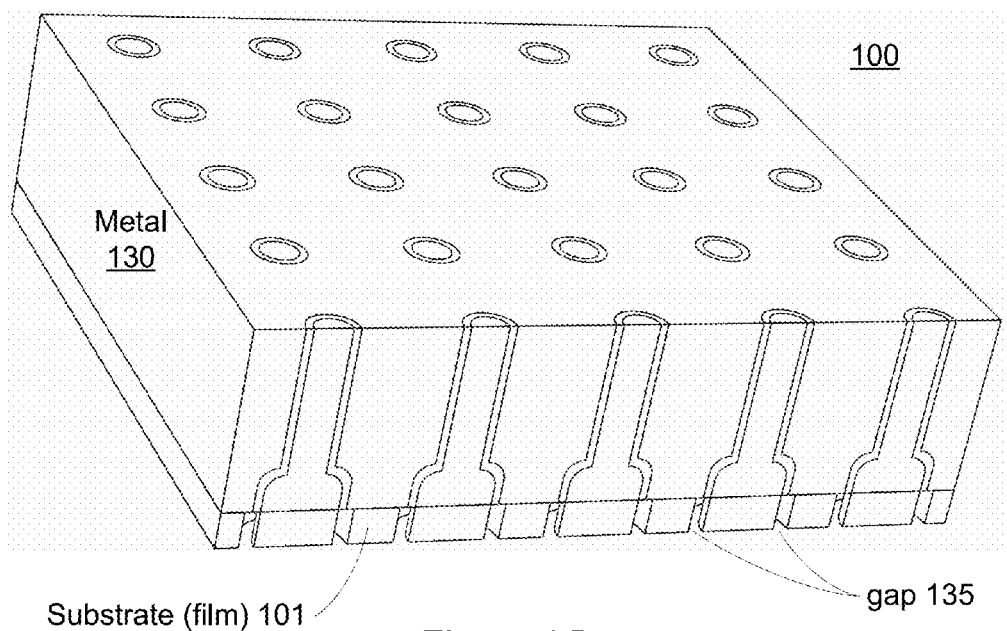

FIG. 1G illustrates a second embodiment of a heat spreading substrate with embedded interconnects 100, in accordance with embodiments of the present invention. In FIG. 1G, a substrate 101 comprising a metal film is optionally patterned to electrically isolate the wire bond pads 110, wires 120A and/or the ball bonds 121 from the metal 130. For example, a gap 135 is formed in film substrate 101.

Figure 1H:
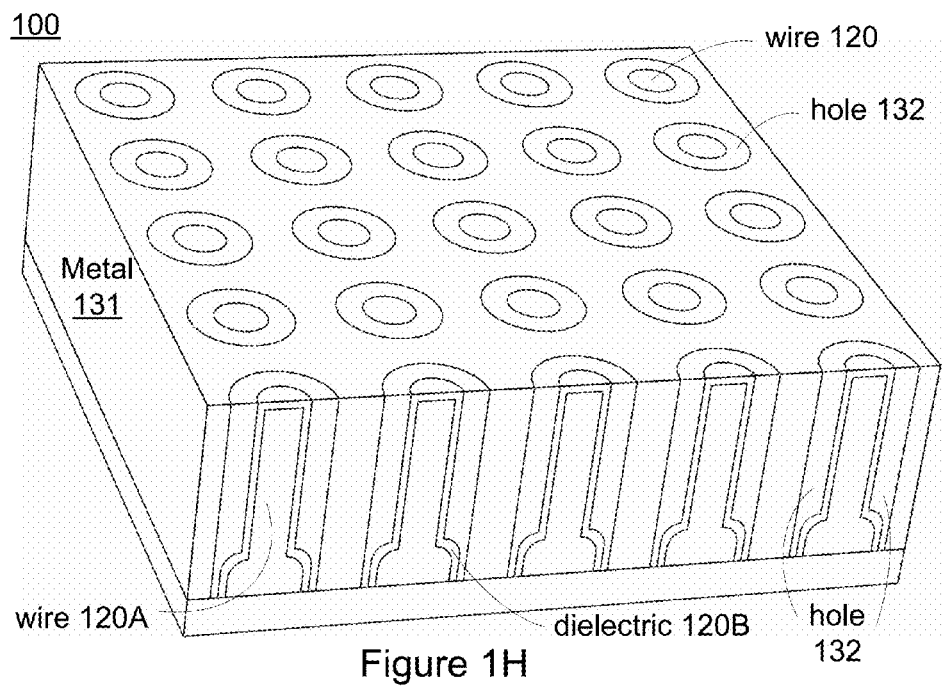

FIG. 1H illustrates a third embodiment of a heat spreading substrate with embedded interconnects 100, in accordance with embodiments of the present invention. FIG. 1H illustrates an alternative method of manufacture of heat spreading substrate with embedded interconnects 100, in accordance with embodiments of the present invention. Starting with the configuration of FIG. 1D, metal 131 is laminated to the substrate or film 101. Metal 131 comprises holes 132 that have been pre-drilled, perforated or otherwise formed. Holes 132 fit over wires 120 and ball bonds 121. After lamination of metal 131 to substrate 101, the remaining volume of the holes 132 may be filled in, e.g., plated.

Figure 1I:
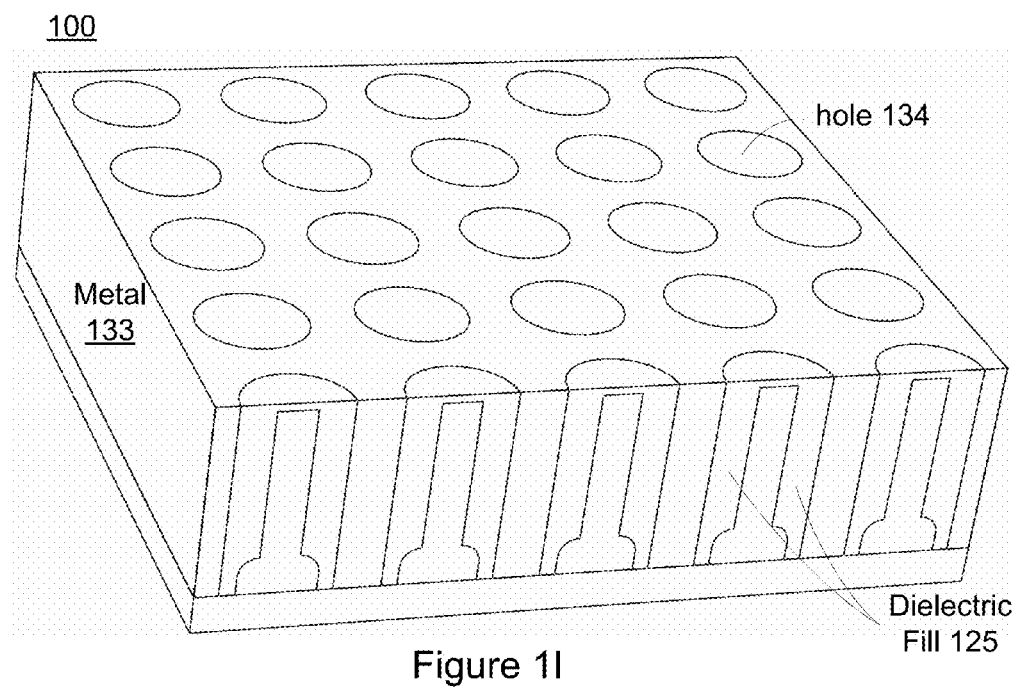

FIG. 1I illustrates a fourth embodiment of a heat spreading substrate with embedded interconnects 100, in accordance with embodiments of the present invention. FIG. 1I illustrates an alternative method of manufacture of heat spreading substrate with embedded interconnects 100, in accordance with embodiments of the present invention. Starting with the configuration of FIG. 1D, metal 133 is laminated to the substrate or film 101. Metal 133 comprises holes 134 that have been pre-drilled or otherwise formed. Holes 134 fit over wires 120A and ball bonds 121. It is to be appreciated that wires 120A may not be coated with dielectric. After lamination of metal 133 to substrate 101, the remaining volume of the holes 134 may be filled with dielectric 125.

Figure 2:
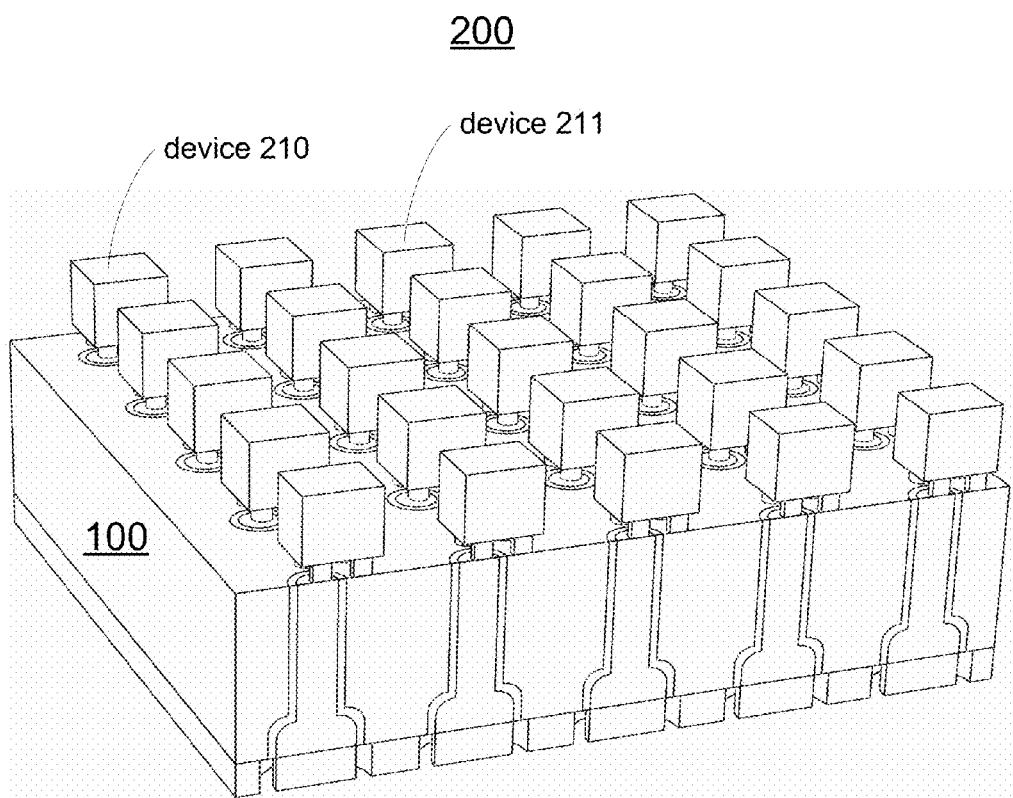
FIG. 2 illustrates an application of heat spreading substrate with embedded interconnects, in accordance with embodiments of the present invention.

FIG. 2 illustrates an application of heat spreading substrate with embedded interconnects 100, in accordance with embodiments of the present invention. In FIG. 2, a plurality of electronic devices 210, 211 have been functionally mounted to heat spreading substrate with embedded interconnects 100 to form electronic assembly 200. Embodiments in accordance with the present invention are well suited to a variety of electronic devices, including, for example, light emitting diodes (LED), radio frequency (RF) devices, motor controllers, power semiconductors and the like.

The plurality of electronic devices 210, 211 need not be of the same design, in accordance with embodiments of the present invention. For example, electronic device 210 may be an LED, whereas electronic device 211 may comprise power and control electronics for LED 210.

Figure 3:
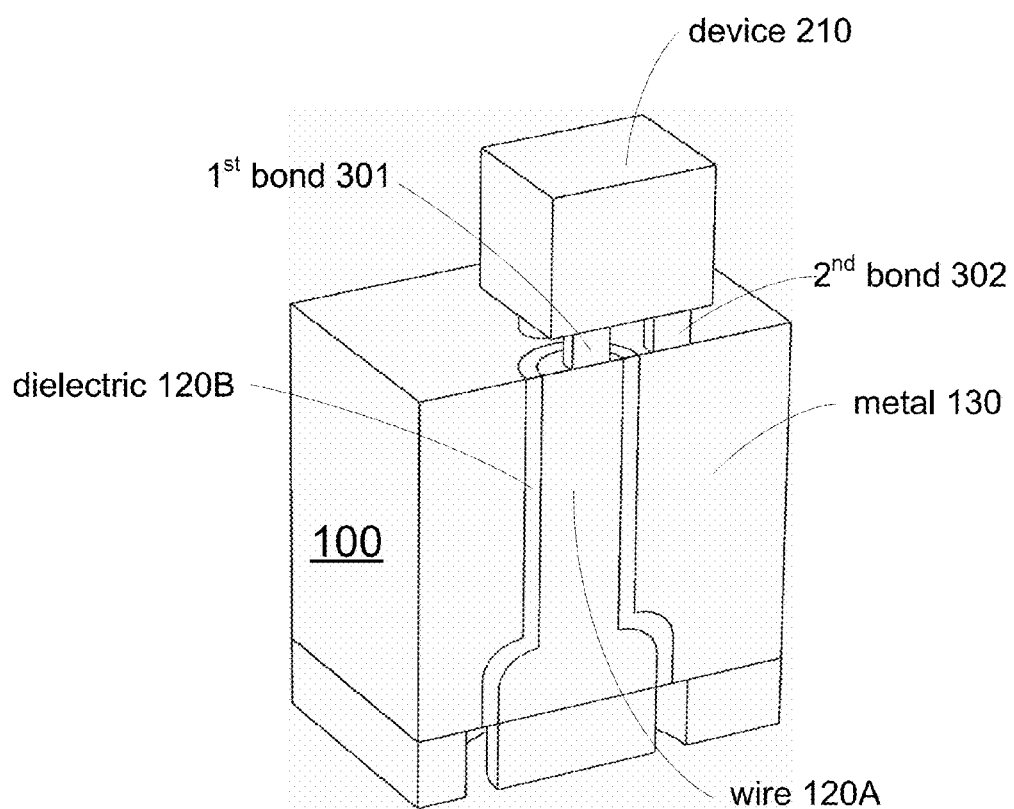
FIG. 3 illustrates a detail of electronic assembly, in accordance with embodiments of the present invention.

FIG. 3 illustrates a detail of electronic assembly 200, in accordance with embodiments of the present invention. In FIG. 3, a first device contact (on the bottom of device 210, not shown) is electrically coupled to the wire 120A via first bond 301, and a second device contact (not shown) is electrically coupled to the conductive body of heat spreading substrate with embedded interconnects 100, e.g., metal 130, 131 or 133, via second bond 302. Bonds 301 and 302 may comprise a variety of bonding types, including, for example, solder balls, controlled chip collapse connections (C4), conductive epoxy and/or eutectic solder. It is to be appreciated that dielectric 120B electrically isolates first lead 301 and wire 120A from second lead 302 and the metal body, e.g., metal 130. Device 210 may be surface mounted to heat spreading substrate with embedded interconnects 100. Alternatively, device 210 may comprise short leads, and such leads may be mounted to heat spreading substrate with embedded interconnects 100.

In accordance with embodiments of the present invention, a plurality of electronic devices, e.g., 210, 211 (FIG. 2) may be surface mounted to a heat spreading substrate with embedded interconnects 100. It is to be appreciated that dielectric 120B may form a solder mask to prevent wicking of solder across contacts of the heat spreading substrate with embedded interconnects 100.

Figure 4:
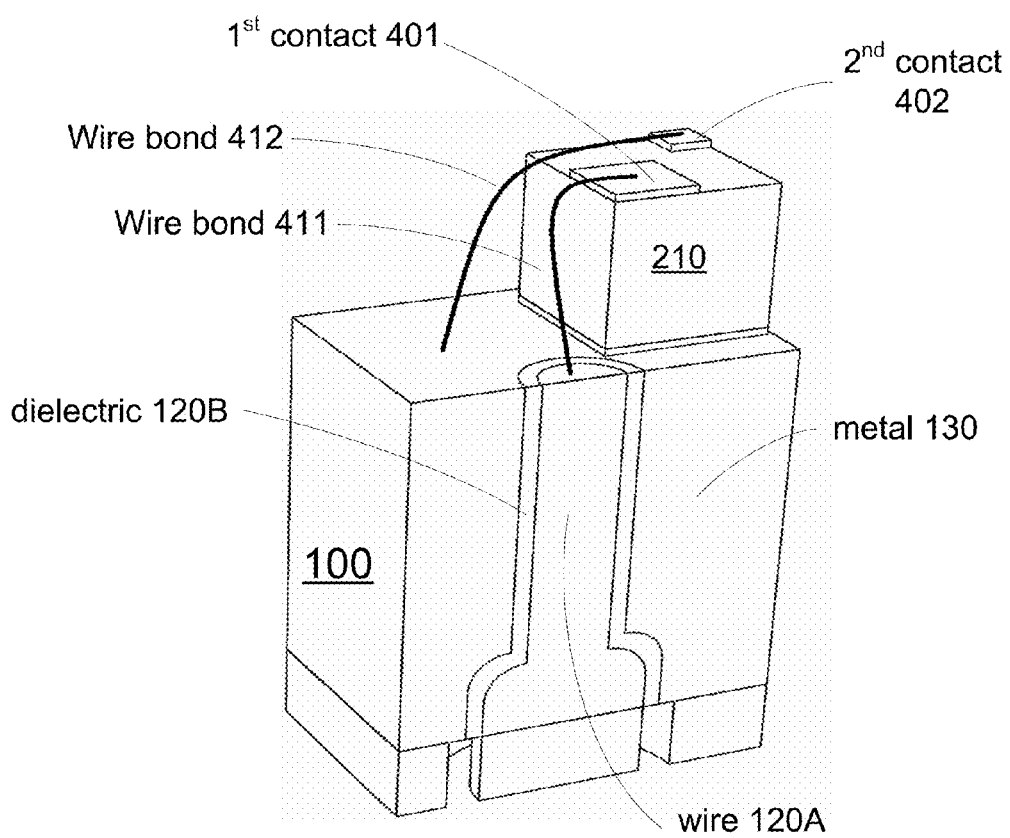
FIG. 4 illustrates a detail of electronic assembly, in accordance with embodiments of the present invention.

FIG. 4 illustrates a detail of electronic assembly 200, in accordance with embodiments of the present invention. In FIG. 4, a first contact 401 is electrically coupled to the end or face of wire 120A via wire bond 411, and a second lead 302 is electrically coupled to the conductive body of heat spreading substrate with embedded interconnects 100, e.g., metal 130, 131 or 133, via wire bond 412. It is to be appreciated that dielectric 120B electrically isolates first contact 401 and wire 120A from second contact 402 and the metal body, e.g., metal 130.

In accordance with embodiments of the present invention, the plurality of electronic devices mounted on heat spreading substrate with embedded interconnects 100 may be individualized or singulated. For example, heat spreading substrate with embedded interconnects 100 may be sawed or otherwise cut between electronic devices.

In accordance with alternative embodiments of the present invention, some contacts of an electronic device may be functionally coupled to heat spreading substrate with embedded interconnects 100 via surface mount methods, while other contacts of the same electronic device may be functionally coupled to heat spreading substrate with embedded interconnects 100 via wire bond techniques. For example, a contact on the bottom of electronic device 210 may be functionally coupled to heat spreading substrate with embedded interconnects 100 via a surface mount connection, while a contact on the top of electronic device 210 may be functionally coupled to heat spreading substrate with embedded interconnects 100 via a wire bond connection. It is to be appreciated that light emitting diodes frequently have electrical terminals at opposite ends of their layer stack. Embodiments in accordance with the present invention are well suited to such applications.

Alternatively, a plurality of electronic devices, e.g., an array or matrix, of similar and/or dissimilar electronic devices may be operated while mounted together on a common instance of heat spreading substrate with embedded interconnects 100. For example, if many of the plurality of electronic devices are light emitting diodes (LED), the assembly may provide more light than a single LED is capable of providing. Alternatively, the array/matrix of LEDs may provide a variety of spectral colors, by combining the light output of multiple, single-color, LEDs.

In accordance with embodiments of the present invention, a plurality of electronic devices may be assembled onto a heat spreading substrate with embedded interconnects 100, as illustrated in FIG. 2. These assemblies are commonly referred to in terms of the electronic device. For example, the combination of one or more light emitting diodes, e.g., 210, 211 (FIG. 2) assembled onto a heat spreading substrate may be referred to itself as a light emitting diode (LED). Similarly, an individual LED mounted on heat spreading substrate with embedded interconnects 100, may also be referred to as an LED.

In this novel manner, heat generated from electronic devices 210, 211 (FIG. 2) is efficiently and cost effectively conducted through the metal 130, 131 or 133 and to any additional heat sinking structures. For example, heat flows "down" in the perspective of FIG. 2. In addition, heat spreading substrate with embedded interconnects 100 may also conduct electrical signals, e.g., voltage and ground, to electronic devices 210, 211.

Figure 5:
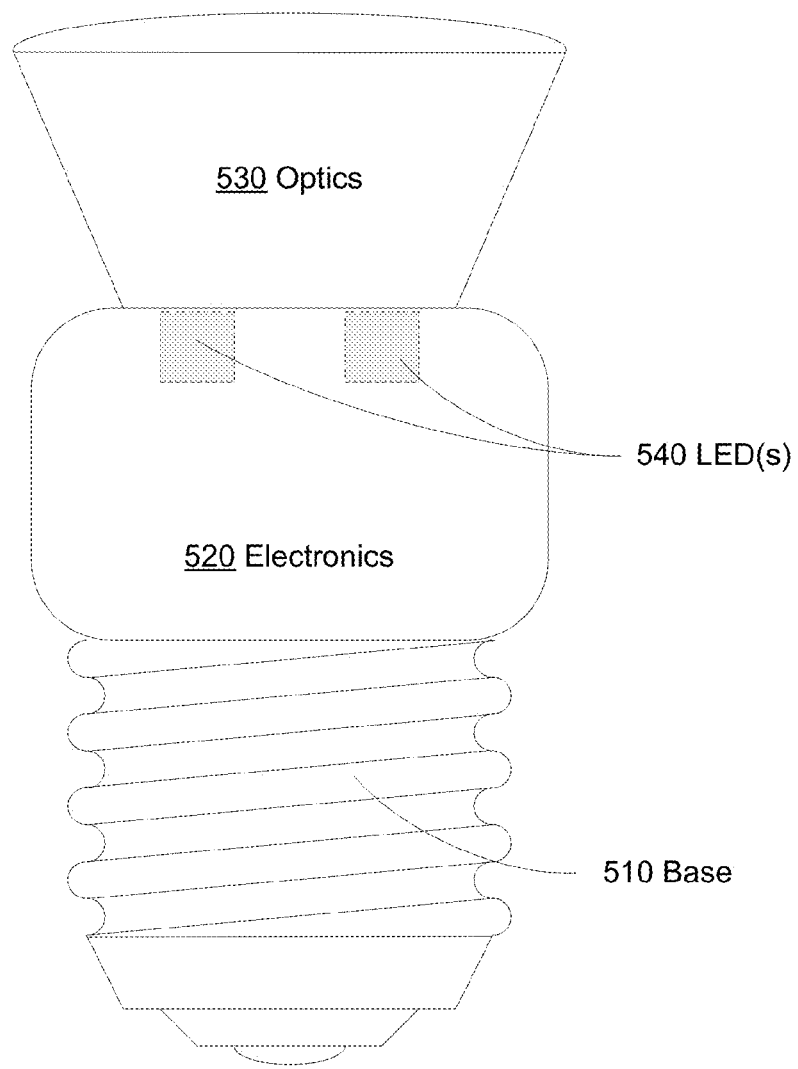
FIG. 5 illustrates an example of an application of a light emitting diode, in accordance with embodiments of the present invention.

FIG. 5 illustrates an example of an application of a light emitting diode, in accordance with embodiments of the present invention. Light source 500 is well suited to a variety of lighting applications, including domestic, industrial and landscape lighting. Light source 500 is also well suited to stage or theatrical lighting. Light source 500 comprises a base 510. As illustrated, base 510 is an Edison type base. It is appreciated that embodiments in accordance with the present invention are well suited to other types of bases, including, for example, GU, bayonet, bipin, wedge, stage pin or other types of bases.

Light source 500 additionally comprises a body portion 520 that houses power conditioning electronics (not shown) that convert 110V AC input electrical power (or 220 V AC, or other selected input electrical power) to electrical power suitable for driving a plurality of light emitting diode devices 540. Body portion 520 may also comprise, or couple to, optional heat sink features (not shown).

Light source 500 additionally comprises optional optics 530. Optics 530 comprise diffusers and/or lenses for focusing and/or diffusing light from the plurality of light emitting diode devices 540 into a desired pattern.

Light source 500 comprises a plurality of light emitting diode devices (LEDs) 540. Individual LEDs of plurality of light emitting diode devices 540 may correspond to assemblies previously described herein. For example, plurality of light emitting diode devices 540 may include instances of devices 210, 211 (FIG. 2). It is appreciated that not all instances of plurality of light emitting diode devices 540 need be identical.

It is to be further appreciated that plurality of light emitting diode devices 540 may include a single heat spreading substrate comprising multiple light emitting devices. For example, a single instance of plurality of light emitting diode devices 540 may comprise a plurality of individual, different, LED devices mounted on a common heat spreading substrate. For example, one instance of an electronic device may be a blue light emitting diode comprising a sapphire substrate. Another instance of an electronic device may be a green light emitting diode comprising a Gallium phosphide (GaP) substrate. Another instance of an electronic device may be a red light emitting diode comprising a Gallium arsenide (GaAs) substrate. The three instances of electronic devices may be arranged in an array on heat spreading substrate with embedded interconnects 100 such that the light from such three colors may be combined to produce a variety of spectral colors. For example, a plurality of light emitting diode devices may operate in combination to produce a "white" light output.

In accordance with embodiments of the present invention, plurality of light emitting diode devices 540 may include additional electronics associated with the LED devices, e.g., as previously described with respect to FIG. 2. In one exemplary embodiment, such additional electronics may comprise circuits to implement a white balance among tri-color LEDs.

Figure 6:
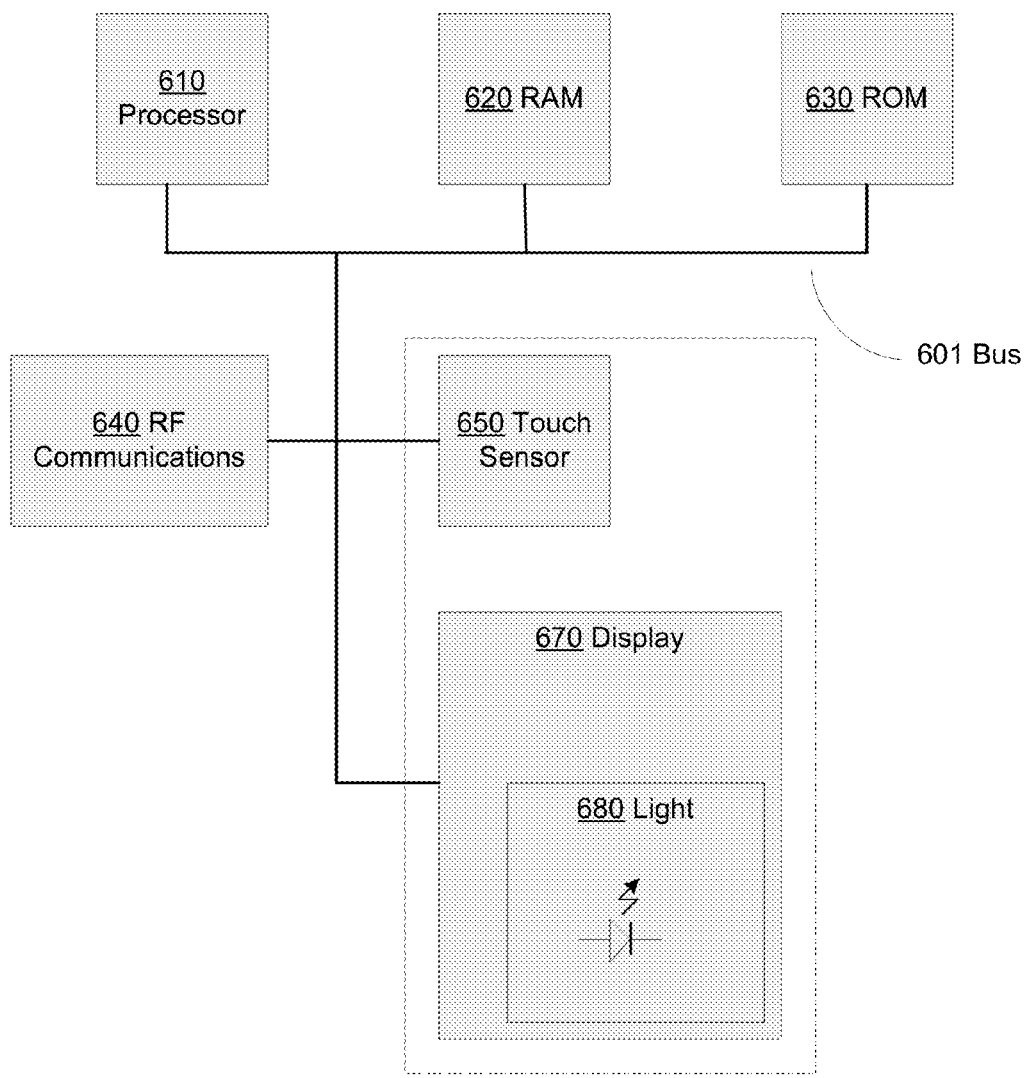
FIG. 6 illustrates an exemplary portable computer system 600, in accordance with embodiments of the present invention.

FIG. 6 illustrates an exemplary portable computer system 600, in accordance with embodiments of the present invention. Portable computer system 600 may be a mobile phone or smart phone, email device, tablet, laptop or netbook computer, personal digital assistant or the like. A bus 601 functionally couples the various functional blocks of system 600. Bus 601 may comprise multiple busses, and any such bus may be a single conductor.

Portable computer system 600 comprises a processor 610. Processor 610 may be any type of processor for executing software, and may comprise multiple distinct processors, including central processing units and graphical processing units. Processor 610 may also be a multi-core device. Processor 610 generally controls the operation of portable computer system 600, and may operate a graphical user interface. For example, processor 610 accepts input, e.g., from touch sensor 650 and/or optional RF communications 640, and may produce output, e.g., to display 670 and/or RF communications 640. Processor 610 may access random access memory (RAM) 620 for programs and/or data, and may also access read only memory (ROM) for programs and/or data.

Portable computer system 600 optionally comprises a radio-frequency (RF) communications subsystem 640. RF communications system 640 is well suited to operate on a variety of radio communication protocols, including, for example, data and/or telephony networks, e.g., Bluetooth, WiFi, TDMA, CDMA, GSM, AMPS and the like. RF communications system 640, if present, operates to communicate voice, image and/or data to and from portable communication system 600.

Portable computer system 600 comprises a touch sensor subsystem 650. Touch sensor 650 may operate as a resistive or capacitive device, and generally functions to accept input to system 600 in the form of a touch, e.g., from a finger and/or a stylus. Touch sensor 650 is generally strongly associated with a display device. For example, a user of system 600 may perceive touching a "screen" rather than a separate touch sensor.

Portable computer system 600 also comprises a display device 670. Display 670 may be any suitable technology, including, for example, an STN or TFT LCD display device Display 670 functions to output images and/or alpha-numeric information from system 600

Portable computer system 600 further includes a light 680 to illuminate display 670. For example, most LCD devices do not directly produce light; rather such devices filter light from another source, e.g., light 680. Alternatively, light 680 may provide supplemental illumination when ambient light is insufficient for viewing display 670.

In accordance with embodiments of the present invention, light 680 comprises a plurality of light emitting diodes. Individual LEDs of plurality of light emitting diode devices 680 may correspond to assemblies previously described herein. For example, plurality of light emitting diode devices 680 may include instances of electronic devices 210, 211 (FIG. 2). It is appreciated that not all instances of plurality of light emitting diode devices 680 need be identical.

Light 680 may illuminate display 670 from the front and/or the back and/or the sides of display 670, and may be referred to as a front light, back light and/or side light. Light from light 680 may be coupled to the display by a diffuser in front of or behind display 670.

Embodiments in accordance with the present invention provide systems and methods for heat spreading substrate with embedded interconnects. In addition, embodiments in accordance with the present invention provide systems and methods for heat spreading substrate with embedded interconnects that are simple and cost effective to manufacture. Further, embodiments in accordance with the present invention provide systems and methods for heat spreading substrate with embedded interconnects that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An apparatus comprising:
   a substrate comprising a plurality of wire bond pads;
   a plurality of bond wires coupled to the wire bond pads;
   a metal parallelepiped over the substrate and encompassing the plurality of bond wires;
   at least two light emitting diodes mounted on said mental parallelepiped;
   wherein said plurality of wires have a different grain structure than said metal parallelepiped; and
   wherein said plurality of wires is electrically isolated from said metal parallelepiped.

2. The apparatus of claim 1 wherein said plurality of wires are electrically isolated from one another.

3. The apparatus of claim 1 wherein said plurality of wires are substantially parallel.

4. The apparatus of claim 1 wherein said plurality of wires are substantially parallel to four faces of said metal parallelepiped.

5. The apparatus of claim 1 wherein said plurality of wires are not parallel to at least one face of said metal parallelepiped.

6. The apparatus of claim 1 further comprising a dielectric for isolating said plurality of wires from said metal parallelepiped.

7. The apparatus of claim 1 further comprising a plurality of ball bonds at one end of said plurality of wires.

8. The apparatus of claim 1 absent any ball bonds.

9. The apparatus of claim 1 further comprising an electronic device, distinct from said at least two light emitting diodes, electrically coupled to said metal parallelepiped and at least one wire of said plurality of wires.

10. The apparatus of claim 9 further comprising a wire bond coupling said electronic device to said at least one wire of said plurality of wires.

11. The apparatus of claim 9 further comprising a surface mount coupling.

12. The apparatus of claim 9 configured to conduct heat generated by said at least two light emitting diodes away from said electronic device.

13. The apparatus of claim 9 wherein said electronic device comprises radio frequency circuitry.

14. The apparatus of claim 9 wherein said electronic device comprises a power semiconductor device.

15. The apparatus of claim 1 further comprising:
a base for coupling to an alternating current supply; and
electronics configured to convert said alternating current to electrical power suitable for driving said at least two light emitting diodes.

16. The apparatus of claim 15 further comprising:
a processor for operating a graphical user interface;
a display for displaying said graphical user interface; and
wherein at least one of said at least two light emitting diodes is configured to illuminate said display.

* * * * *